United States Patent [19]
Saeger et al.

[11] Patent Number: 5,565,928
[45] Date of Patent: Oct. 15, 1996

[54] CIRCUIT FOR GENERATING A SCAN AT A MULTIPLE OF A SYNCHRONIZING SIGNAL

[75] Inventors: Timothy W. Saeger; Donald H. Willis, both of Indianapolis, Ind.

[73] Assignee: Thomson Consumer Electronics, Inc., Indianapolis, Ind.

[21] Appl. No.: 257,980

[22] Filed: Jun. 10, 1994

[51] Int. Cl.$^6$ .................................................... H04N 5/12
[52] U.S. Cl. ........................................... 348/540; 348/542
[58] Field of Search ..................................... 348/536, 540, 348/541, 542, 441, 449; 331/20; H04N 5/12

[56] References Cited

U.S. PATENT DOCUMENTS

| | | | |
|---|---|---|---|
| 4,860,090 | 8/1989 | Murata et al. | 348/449 |
| 5,121,086 | 6/1992 | Srivastava | 348/546 X |

Primary Examiner—Victor R. Kostak
Attorney, Agent, or Firm—Joseph S. Tripoli; Joseph J. Laks; Daniel E. Sragow

[57] ABSTRACT

In a synchronizing circuit, an oscillator provides an output signal at a frequency that is a higher integral multiple than that of a synchronizing input signal. A control circuit, responsive to the input signal and a feedback signal representative of the output signal, generates a control signal that is indicative of a difference in phase or frequency between the input and output signals. The oscillator is responsive to the control signal for synchronized tracking of the output signal to the input signal. The control signal exhibits a periodic variation which tends to result in a deviation of the oscillator output signal from its synchronized tracking condition in accordance with the periodic variation. The phase of the output signal is offset relative to a corresponding phase of the periodic variation of the control signal for counteracting this deviation.

36 Claims, 6 Drawing Sheets

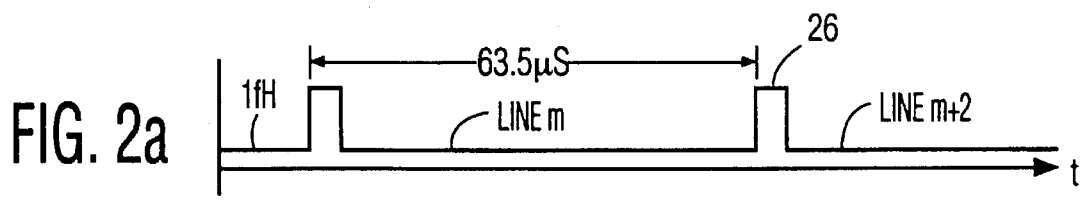
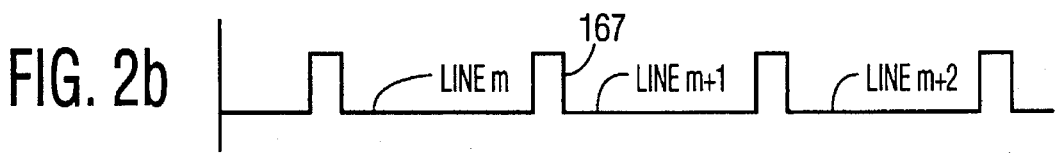
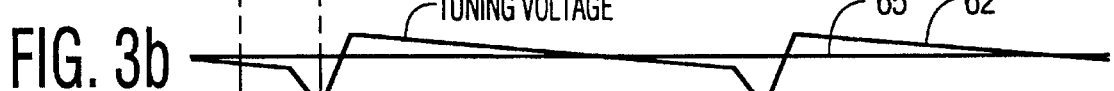
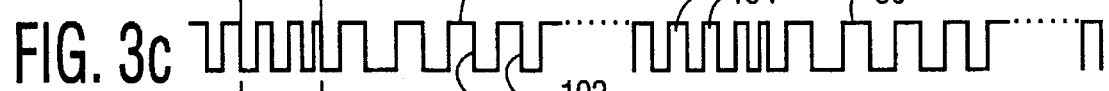
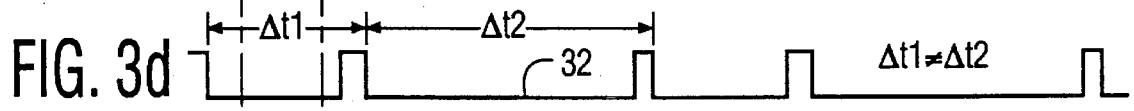
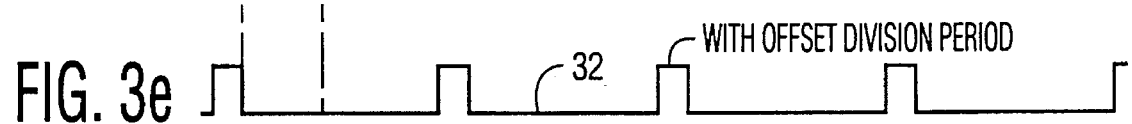
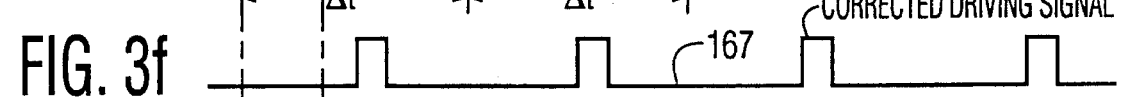
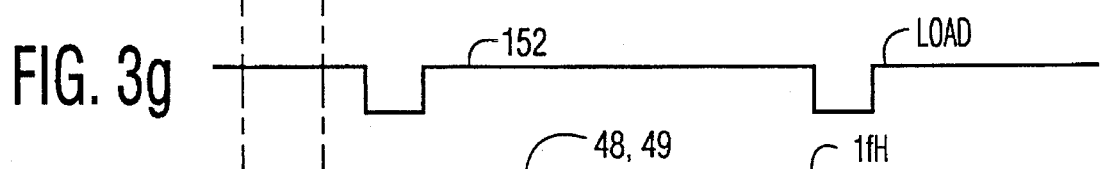

| ABCD | $\overline{\overline{(A+B)}\overline{CD}}$ |
|------|------|
| 0000 | 0 ⎫ |
| 0001 | 0 ⎬ 156 |
| 0010 | 0 ⎭ |
| 0011 | 1 |
| 0100 | 1 |
| 0101 | 1 |
| 0110 | 1 |
| 0111 | 1 |
| 1000 | 1 |
| 1001 | 1 |
| 1010 | 1 |
| 1011 | 1 |
| 1100 | 1 |
| 1101 | 1 |
| 1110 | 1 |
| 1111 | 1 |

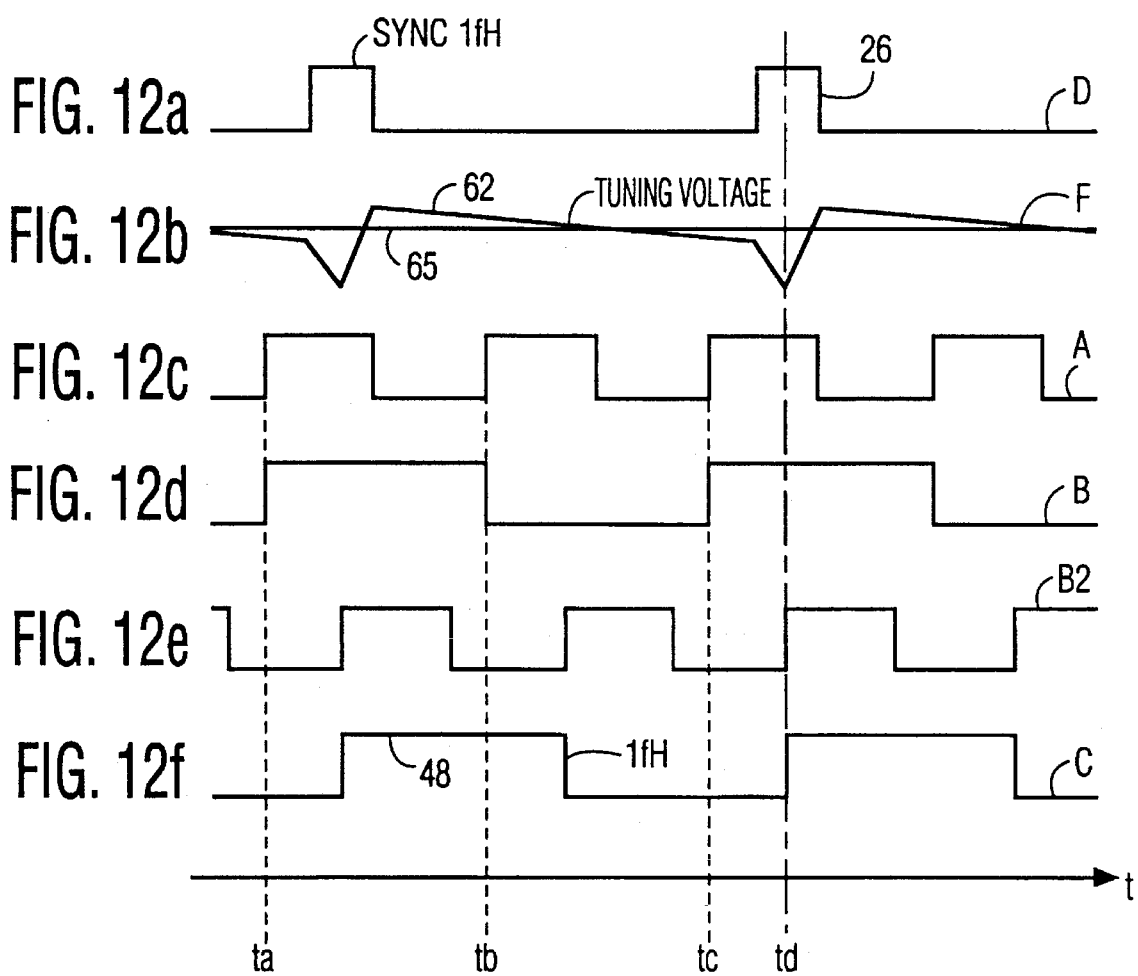

5,565,928

CIRCUIT FOR GENERATING A SCAN AT A MULTIPLE OF A SYNCHRONIZING SIGNAL

The invention relates to phase locking a voltage controlled oscillator to a synchronizing input signal.

BACKGROUND

Raster scanning circuits of television receivers are synchronized to the synchronizing component or sync of the received video signal, which includes horizontal and vertical synchronizing components delineating horizontal lines and vertical fields. The standard NTSC video signal, for example, is defined by two successive fields of 262.5 horizontal lines each, at a horizontal line frequency of 15,734 Hz, designated fH or 1 fH or 1 H. The horizontal lines of the two fields are interlaced by successive display to form a complete 525 line video frame that recurs at a 29.97 Hz rate.

Efforts to improve the picture quality of television receivers have included the development of progressively scanned or noninterlaced display systems in which a full frame of 525 lines is displayed during the time allotted for one 262.5 line field in the video signal. This requires that the horizontal lines be scanned at a display frequency equal to twice the video signal frequency, or 2 fH, while operating in sync with the video signal. It is necessary for such a television receiver to generate a horizontal triggering signal at a display frequency that is twice the horizontal frequency of the video signal, effectively inserting horizontal triggering pulses precisely between the pulses obtained from the input sync signal. Similarly, one might display a 1 fH video signal at some other multiple of the video signal frequency. For example, a 1 fH or 2 fH video signal could be displayed at a 4 fH display scanning frequency, or another multiple could be used.

A circuit for generating a display frequency signal advantageously involves a multiplying phase locked loop that tracks the synchronizing component of the received input signal. In a multiplying phase locked loop, for example, to develop horizontal triggering signals locked to a received video signal, a voltage controlled oscillator is typically operated at a frequency that is some multiple of the input signal. The output of the voltage controlled oscillator is counted down by that multiple, namely to 1 fH, for example, using one or more counters or flip-flops as a frequency divider. The counted down 1 fH signal from the frequency divider is fed back to a phase comparator that is responsive to the synchronizing component of the video signal and generates an output voltage as a function of the phase alignment between the synchronizing component of the video signal and the oscillator. The output of the phase comparator provides a tuning voltage for controlling the frequency of the oscillator, enabling the television receiver to seek and lock onto the synchronizing component of the video signal.

Assuming the input video signal is stable, the phase comparator generates a tuning voltage when the loop is locked, where the average or direct current component of the tuning voltage is stable. The tuning voltage, however, may vary periodically at the rate of the synchronizing signal, e.g. in a ramp or sawtooth manner, depending upon the circuit used to filter the tuning voltage. The sawtooth modulates the oscillator output frequency within the period of the synchronizing input signal, even though the counted down 1 fH signal is held correctly in phase with the video synchronizing signal. A triggering signal can be generated from such a circuit at a multiple of the 1 fH signal by tapping at a point in the frequency divider chain that produces an output at a frequency higher than the 1 fH feedback signal that is the basis of phase locking control. Undesirably, pulses at such higher frequency will not occur symmetrically between pulses at the controlled 1 fH frequency because of the sawtooth modulation of the oscillator frequency introduced by the AC component of the tuning voltage.

The effect of such periodic variations in the oscillator frequency may be appreciated in connection with an example wherein the voltage controlled oscillator operates at 32 fH. The oscillator output is frequency divided by 32 to produce a 1 fH feedback signal to the phase comparator. The oscillator frequency is divided by 16 to provide a 2 fH signal for controlling deflection circuitry used for noninterlaced horizontal scanning. When the 32 fH output frequency varies during a 1 fH cycle due to tuning voltage modulation, alternate horizontal lines at 2 fH will be of unequal length. A tearing effect is produced in the display because alternate lines are of different lengths and are not vertically aligned. Resonance effects of the deflection circuitry tend to enhance this tearing effect, which is highly undesirable in a noninterlaced display.

The phase comparator output is typically coupled to the oscillator through a low pass filter that can reduce the extent to which the oscillator output frequency is modulated at a 1 fH rate. However, extensive filtering reduces the response and tracking ability of the phase locked loop. Additionally, a plurality of phase locked loops may be cascaded, where a first phase locked loop generates a 2 fH triggering signal from the synchronizing input signal and a second phase locked loop associated with the deflection circuit synchronizes scanning to the generated 2 fH triggering signal. However, there are conflicting requirements on the two phase locked loops, and sufficient attenuation of the 1 fH component may not be achievable without sacrificing some other system parameter.

BRIEF DESCRIPTION OF THE DRAWING

FIGS. 2(a) and 2(b) are timing diagrams comparing the video synchronization and horizontal scanning triggering signals in a noninterlaced display television receiver.

FIGS. 3(a) through 3(h) are timing diagrams comparing the horizontal synchronizing signal, tuning voltage, oscillator output and triggering signals developed by the circuit of FIG. 1.

FIGS. 12(a) through 12(f) are timing diagrams comparing the horizontal synchronizing signal, tuning voltage, oscillator output and triggering signals developed by the circuits of FIGS. 9 and 10.

SUMMARY

In a synchronizing circuit, an oscillator provides an output signal at a frequency that is a higher integral multiple than that of a synchronizing input signal. A control circuit, responsive to the input signal and a feedback signal representative of the output signal, generates a control signal that is indicative of a difference in phase or frequency between the input and output signals. The oscillator is responsive to the control signal for synchronized tracking of the output signal to the input signal. The control signal exhibits a periodic variation which tends to result in a deviation of the oscillator output signal from its synchronized tracking condition in accordance with the periodic variation. The phase of the output signal is offset relative to a corresponding phase of the periodic variation of the control signal for counteracting this deviation.

DETAILED DESCRIPTION

Figure 1:
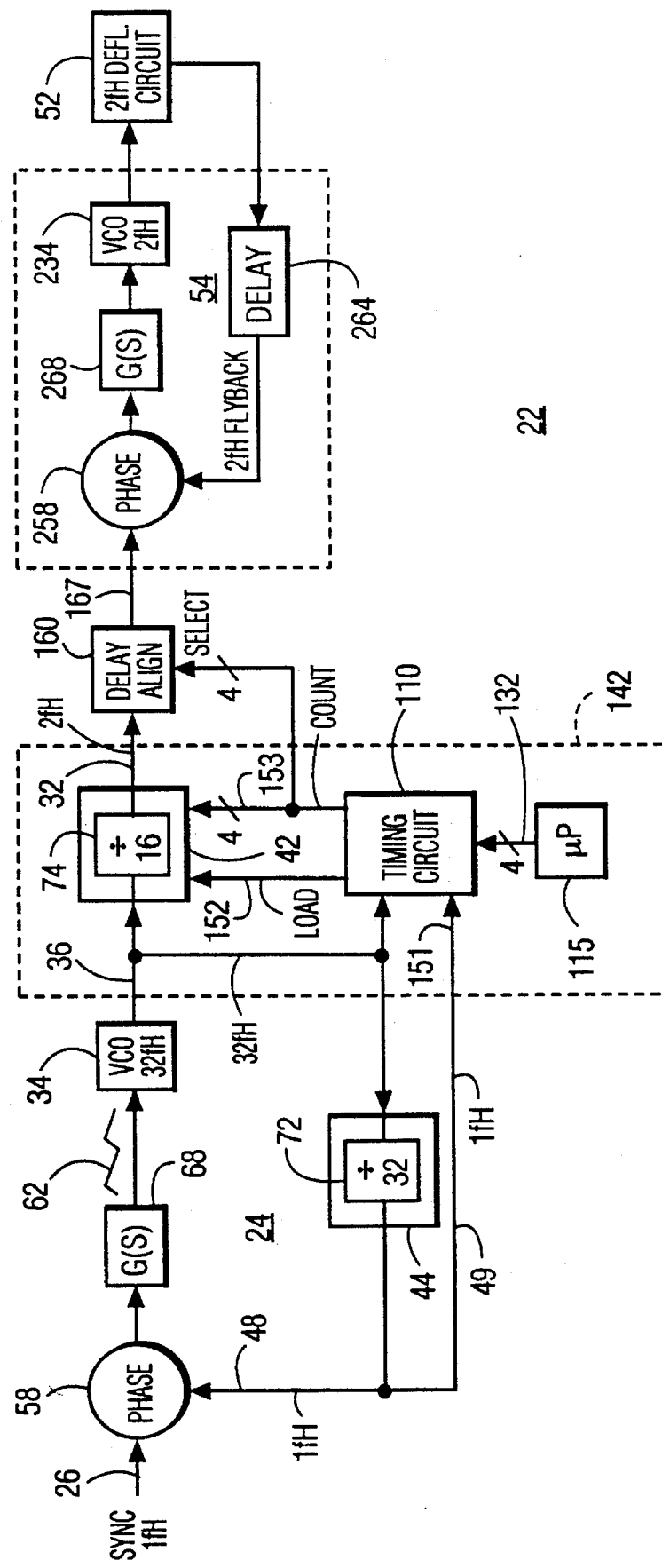
FIG. 1 is a block diagram schematic showing the elements of the inventive synchronizing circuit as applied to a television receiver.

FIG. 1 illustrates a synchronizing circuit 22, especially for a television receiver, according to an exemplary inventive embodiment. Synchronizing circuit 22 includes a first phase locked loop 24 that is responsive to a synchronizing input signal 26 at a sync frequency, and a second phase locked loop 54 that is responsive to an output 167 from first phase locked loop 24. Synchronizing input signal 26 may be the horizontal scanning component or sync of a standard video signal, recurring at a frequency 1 fH. In order to provide noninterlaced scanning, synchronizing circuit 22 develops a triggering output 32 at a multiple of the input sync frequency, for example at twice the sync frequency, or at a 2 fH frequency. For this purpose, a controllable oscillator 34 or VCO generates an output signal at a first, relatively higher multiple of the sync frequency, such as 32 fH. At least one divider 42 counts down the output of oscillator 34 over a division period, to provide a triggering signal at a different multiple of the sync frequency, such as 2 fH in the example shown. Other specific multiples of the sync frequency may be used for scanning or other purposes in the television receiver.

Two frequency dividers 42, 44 are provided in the embodiment illustrated. A phase selectable divider 42 has a loadable counter 74 dividing by 16 to develop a 2 fH signal from the 32 fH output of oscillator 34. The other divider 44 divides by 32 by means of a counter 72, to provide a 1 fH signal 48 that is fed back for phase comparison with input signal 26 in phase locked loop 24. Output signal 32 at 2 fH is coupled to deflection circuit 52 of the television receiver, for example, providing a triggering or reference signal for second phase locked loop 54, associated with the horizontal deflection winding and the flyback transformer, not illustrated, of the television receiver.

Synchronizing input signal 26 and the fed back phase locking signal 48 developed by dividing the frequency of oscillator output 36, provide inputs to a phase comparator 58 operable to compare phase locking signal 48 and synchronizing signal 26. Phase locked loop 24 produces a tuning voltage 62 having an average value representing the extent of phase alignment of the two inputs. Phase comparator 58 and filter 68 generate an output waveform shown in FIG. 3(b), with a periodic component at the sync frequency, and a direct current component or average value 65. If the two input signals 26, 48 remain aligned in phase and frequency, direct current component 65 remains constant. If one or the other of signals 26, 48 leads or trails the other in phase or frequency, direct current component 65 changes. The phase comparator tuning voltage 62 is generated by means of a filter 68 having a transfer function G(s), generally a low pass function, to provide control of oscillator 34. In this manner phase locked loop 24 seeks and maintains a lock or tracking of oscillator frequency and phase with input synchronizing signal 26.

Frequency dividers 42, 44 each have a division period through which they cycle repetitively. Divide-by-16 divider 42 has a four bit binary counter 74. Divide-by-32 frequency divider 44 includes a five bit binary counter 72. The divide-by-32 counter is synchronized to 1 fH input signal 26 by action of phase comparator 58 and oscillator 34, but divide-by-16 counter 74 must be preset in order to ensure that the division cycles of the two counters begin on the same period of 32 fH oscillator 36. This preset may be accomplished by coupling the 1 fH output of divide-by-32 counter 72 to counter 74, or directly connecting 1 fH line 49 and counter preset trigger line 152 in FIG. 1. The division period of counter 74 then begins at the same 32 fH period as the division period of counter 72, although divide-by-16 counter 74 cycles through two division periods for every division period of divide-by-32 counter 72. This could lead to the 1 fH modulation problem discussed above.

In carrying out an inventive feature, counter 74 is parallel loadable, and a phase offsetting circuit 142 is provided to offset the phase of the division period of divide-by-16 counter 74 and thus adjust the phase of 2 fH period used to develop triggering signal 32, relative to a phase of synchronizing signal 26. This is advantageous for eliminating modulation of the 2 fH counted down output 32 of synchronizing circuit 22, at the 1 fH input frequency. Output signal 32 is then adjusted by a delay alignment block 160 to provide a drive signal 167 with the correct phase relationship to original sync input 26. The 2 fH drive signal 167 is used as the synchronizing input to the following phase locked loop 54. Phase locked loop 54 is conventional and comprises a phase comparator 258, a low pass filter 268, a controlled oscillator 234 for driving deflection circuit 52, and a 2 fH flyback feedback to phase comparator 258 from deflection circuit 52. A further delay block 264 may be inserted in the feedback signal, for example, to adjust the phase for horizontal picture centering.

Operation of synchronizing circuit 22 may be appreciated from the timing diagrams of FIGS. 2(a), 2(b) and 3(a) through 3(h). A standard video signal arranged for interlaced video fields contains successive first and second fields during successive vertical intervals. In FIG. 2(a), every other horizontal line m, m+2 is transmitted between 1 fH pulses on synchronizing input signal 26, and the fields of even and odd numbered lines are interleaved by successive display during alternating vertical periods, to provide a complete frame. For noninterlaced scanning, however, the horizontal scanning rate must be twice as fast as the video horizontal sync rate, as illustrated in FIG. 2(b) by driving signal 167. As shown in FIGS. 2(a) and 2(b), the 1 fH pulses and the 2 fH pulses are aligned. These signals are idealized, and it may also be appropriate in a particular embodiment to offset the phase of the 2 fH signal relative to the 1 fH input, for example, as a means to horizontally center the video in the display.

The horizontal triggering pulses for the deflection circuit should be separated by the same interval between pulses. However, phase comparator 58 produces a tuning voltage 62, illustrated in FIG. 3(b) that varies periodically at a 1 fH rate around an average value 65. Filter 68 may reduce the periodic component generated by operation of the phase comparator but normally will not completely remove the periodic component. Moreover, extensive filtering would undesirably change the response of the phase locked loop. Tuning voltage 62 thus causes a periodic 1 fH variation in the pulse width of output 36 of oscillator 34, shown in exaggerated manner in FIG. 3(c). Pulses 102 at the output 36 of oscillator 34, for example, are wider than the average pulse width over a 1 fH period, when tuning voltage 62 is relatively higher than its average 65. Pulses 104, occurring when tuning voltage 62 is relatively lower than the average, are narrower. The variation does not adversely affect the period of the divide-by-32 counter 72, which operates to keep phase locked loop 24 in sync with synchronizing input signal 26 at 1 fH because over the period of signal 26 the longer and shorter pulses average out over the 32 cycles.

Figure 4:
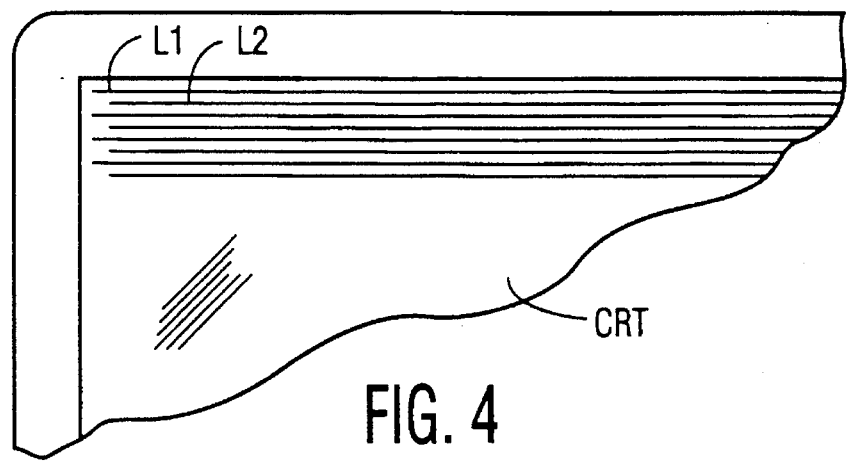
FIG. 4 is a display diagram showing a raster splitting effect.
Figure 5A:
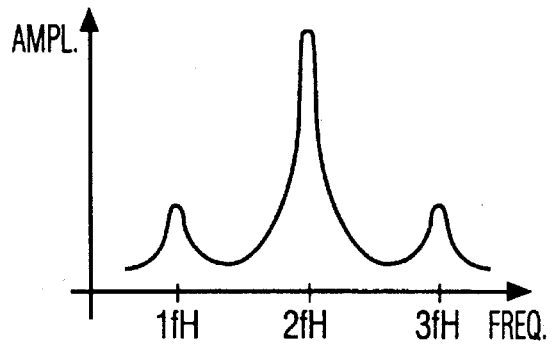
FIGS. 5(a) and 5(b) are frequency spectra, respectively, illustrative of the signals as shown in FIG. 3(d), and as corrected according to an inventive feature.

If divide-by-16 counter 74 were to be operated on a counting cycle that begins at the beginning of the counting cycle of divide-by-32 counter 72, then divide-by-16 counter 74 will be affected by the 1 fH variation in pulse width, because the variation period spans more than one division cycle of counter 74. Counter 74 predominantly counts pulses 102 of a longer than average period over a first 2 fH division period and then shorter than average pulses 104 in the next division period. Although phase locked loop 24 is accurately locked at 1 fH, signal 32 at 2 fH is not symmetrical, as shown in FIG. 3(d), where the interval Δt1 is shorter than the interval Δt2. Using a signal 32 that has the characteristic shown in FIG. 3(d) to trigger horizontal scanning has the result shown in FIGS. 4 and 5(a). Successive 2fH horizontal scanning lines L1 and L2 are unequal in duration and display position. The frequency spectrum as shown in FIG. 5(a) produces in addition to the desired 2 fH signal, unwanted frequency components at 1 fH and 3 fH. The practical effect, as shown in FIG. 4, is to split the raster, line by line.

Referring to FIG. 1, according to art inventive aspect, raster line splitting is alleviated by providing a phase offsetting circuit 142 to offset the phase of the divide-by-16 frequency division period relative to a phase of synchronizing input signal 26. More particularly, the divide-by-16 period during which counter 74 counts through a division cycle is shifted relative to 1 fH signals 26, 48, and relative to the division period of the divide-by-32 counter, which is synchronized by operation of phase locked loop 24 to input signal 26. The amount of this shift is sufficient to move the divide-by-16 division period relative to 1 fH signals 26, 48 to a point where some longer 32 fH pulses 102 and some shorter 32 fH pulses 104 fall into every division period, such that successive 2 fH division periods are substantially equal in time, as shown by output signal 32 in FIG. 3(e). Stated another way, the 2 fH division period is shifted sufficiently, relative to tuning voltage 62 and feedback signal 48, so that the average value of tuning voltage 62 around its AC zero voltage line 65, is the same during each successive divide-by-16 counting cycle or division period. In FIGS. 3a–3h, this phase or time shift is represented by the interval t1–t2.

Figure 5B:
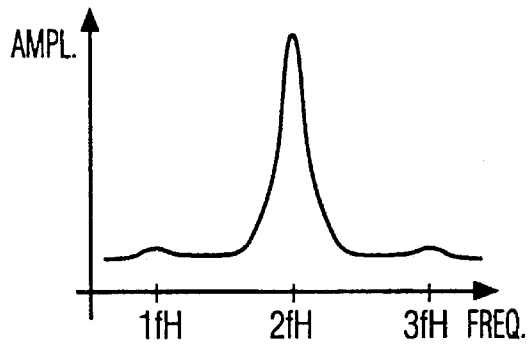

The extent of phase shifting of the divide-by-16 period relative to the 1 fH period may be set to a predetermined counted number of 32 fH cycles. This number is selected for obtaining the optimal phase relationship between the divide-by-16 period and the 1 fH synchronizing signal period. As shown in FIG. 5(b), selecting the phase to the 32 fH period or count that is nearest to optimum phase was found to reduce 1 fH modulation of the 2 fH horizontal triggering frequency by as much as 18 dB.

Figure 6:
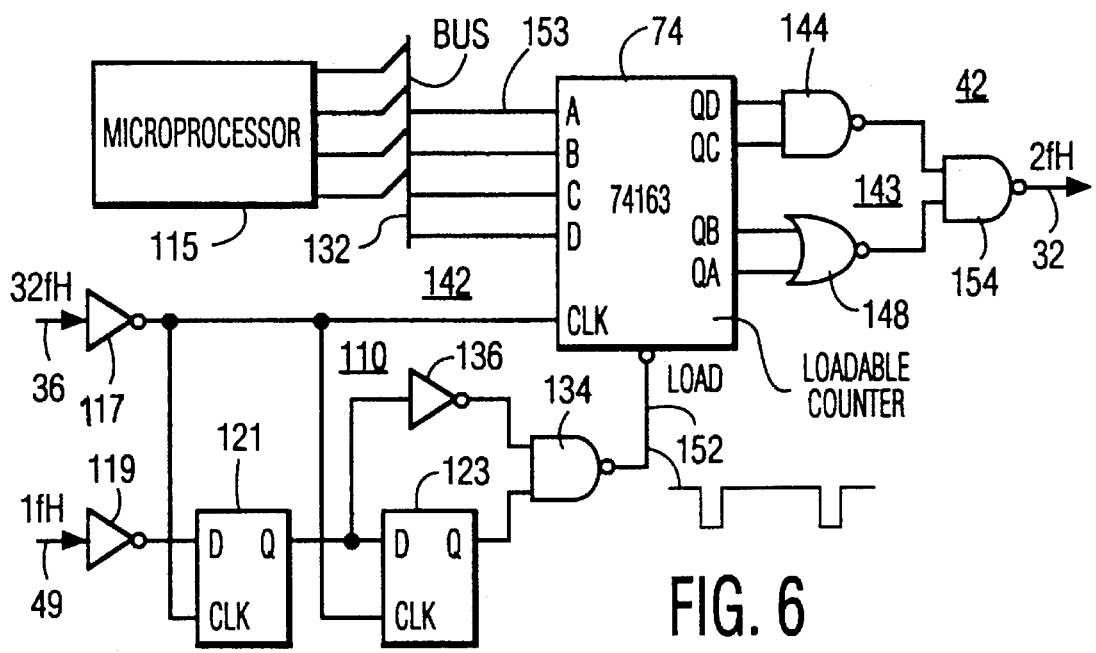
FIG. 6 is a detailed circuit diagram showing an exemplary circuit for offsetting the phase of a 2 fH triggering signal relative to the video synchronizing signal.
Figures 7, 8:
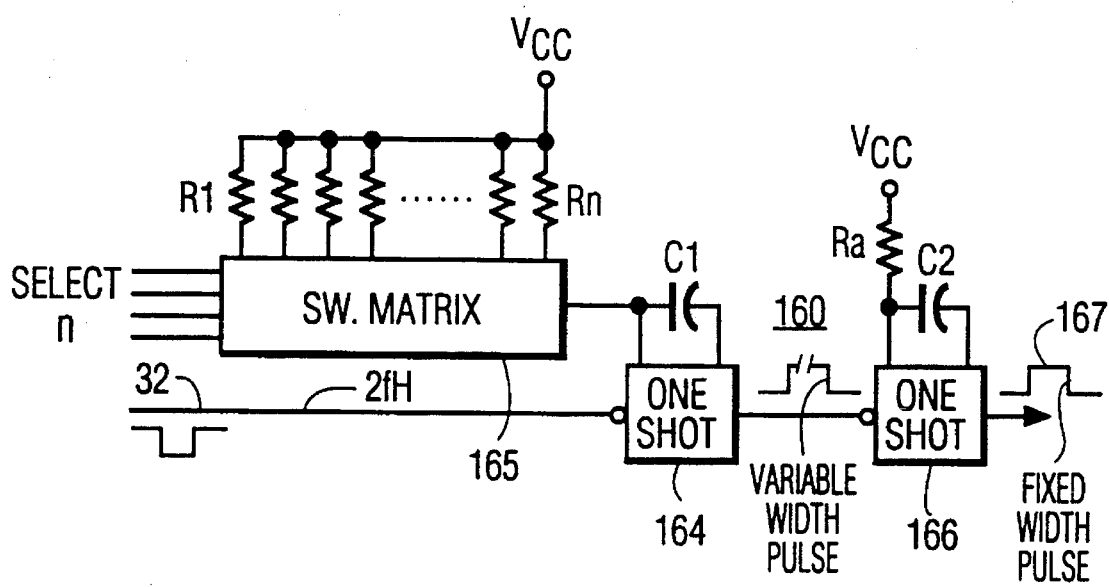
FIG. 7 is a logic table showing the output of the circuit according to FIG. 6.
FIG. 8 is a block diagram illustrating a delay alignment circuit, for repositioning the phase of the 2 fH triggering signal.

FIG. 1 in conjunction with FIGS. 6–8 illustrate an inventive embodiment where the phase of the division periods of divide-by-16 counter 74 may be shifted by a specific counted number of 32 fH cycles relative to the division period of divide-by-32 counter 72, and relative to input sync signal 26. Phase offsetting circuit 142 includes a timing circuit 110 coupled between 1 fH signal 49 from counter 72 and a preset input 152 of divide-by-16 counter 74. Phase offsetting circuit 142 provides a count at which divide-by-16 counter 74 produces an output pulse on 2 fH triggering signal 32, thus determining the phase of the division cycle. In the embodiment shown, the count is set from an output of a microprocessor or controller 115 of the television receiver, via timing circuit 110, for example, by preloading a count into divide-by-16 counter 74 at an edge of the 1 fH signal. Counter 74 is then allowed to cycle through two division periods or two progressions of 16 counts until preloaded again. Any particular count is capable of being preloaded as necessary to obtain the desired phase shift of the 2 fH signal, to a resolution of one part in 16. Divide-by 16 counter 74 is thus reset with every cycle of the 1 fH signal, keeping counter 74 in sync with counter 72, and, at the same time, the 2 fH output signal 32 is made symmetrical due to the phase shift.

Use of microprocessor 115 to set the preload count is only one alternative. Hardwire jumpers, circuit switches or other means also are possible means to provide a phase selection input 132 to inputs 153 of counter 74.

FIG. 6 shows phase offsetting circuit 142 in more detail, for offsetting the phase of the 2 fH division period relative to a phase of synchronizing signals 26 or 48, such that the average value of tuning voltage 62 is equal during successive periods of 2 fH output signal 32. Timing circuit 110 is synchronous with the 32 fH signal and preloads counter 74 during each 1 fH cycle. Oscillator output signal 36 at 32 fH is coupled through an inverter, driver 117 to the clock inputs of two cascaded D-flipflops 121, 123 and to the clock input of four bit binary counter 74. Counter 74 is parallel loaded or preset by microprocessor 115 over a four bit bus 132, coupled to parallel input 153 of counter 74. A serial bus configuration is an alternative possibility, not illustrated. The D-input of the first flipflop 121 is coupled via an inverter 119 to the fed back synchronizing input signal 49 at 1 fH, such that a change of state at the 1 fH frequency appears on the output of flipflop 121 at the following period of the 32 fH signal, and is coupled to the D-input of the next flipflop 123 in cascade. The output of second flipflop 123 is coupled to an input of a NAND gate 134, whose other input is coupled to the D-input of the flipflop via an inverter 136.

On the 32nd count, the output of divide-by-32 counter 72 goes high, shown as signal 49 in FIGS. 3(h) and 6, and the input to the first flipflop 121 goes low, as does the output of NAND gate 134 one count later. Binary counter 74 is then loaded from bus 132 with a preselected starting count. The 1 fH signal 49 does not change state for a number of 32 fH cycles, but the counter load signal goes high after one 32 fH clock cycle, permitting binary counter 74 to count 32 fH pulses from the voltage controlled oscillator. Counter 74 counts for 32 pulses, namely through two division periods at 2 fH, until preloaded again at the next rising edge of 1 fH signal 49.

Binary counter 74 operates as the divide-by-16 counter according to this embodiment. The four outputs of binary counter 74 are coupled as inputs to a gating circuit 143 that provides a pulse output during at least one, but typically a number of adjacent clock cycles at 32 fH. Gating circuit 143 includes a NAND gate 144 and a NOR gate 148, the outputs of which are coupled to a further NAND gate 154. In addition to providing an output at a divide-by-16 or 2 fH rate from the counted output of 32 fH oscillator 34, gating circuit 143 provides a 2 fH output pulse that is low for three 32 fH clock cycles during each 2 fH period. This pulse width is obtained due to the logic arrangement as shown in the table of FIG. 7.

Binary counter 74 may be loaded to any four bit number and still continuously cycle. By choosing the starting count loaded into binary counter 74 from bus 132, the phase position of the three low cycles during each 2 fH period may be placed anywhere in the 16 count positions at 32 fH that occur during the 2 fH division period.

As part of a television receiver setup function, a desired phase offset is selected for the timing edge of the 2 fH output signal 32 relative to the timing edge of synchronizing signal 26, such that the average value of tuning voltage 62 is equal over successive 2 fH periods of triggering signal 32. Individual 32 fH pulses of oscillator 34 are permitted to vary in width, but the 2 fH division periods are equal in time because the longer and shorter pulses 102, 104 are distributed roughly equally in successive periods, rather than longer pulses being counted predominantly during one period and shorter pulses predominantly during next. As a result, the duration of each successive 2 fH period is substantially the same. As shown in FIG. 5(b), the frequency spectrum of output signal 32 is substantially corrected of undesirable modulation. Although modulation at the 1 fH frequency is eliminated as explained above, the phase position of transitions on 2 fH signal 32 have been displaced relative to the 1 fH period. It may be advantageous to maintain a particular phase relationship between the 2 fH signal and the synchronizing input signal, e.g., with the 2 fH pulses aligned with the 1 fH signal, such that deflection circuit 52 coupled to second phase locked loop 54 operates in step with synchronizing input signal 26. According to another inventive feature, the phase relationship of 2 fH output signal 32 is adjustable relative to synchronizing input signal 26 by a delay alignment circuit 160, as shown generally in FIG. 1 and in a specific embodiment in FIG. 8. In FIG. 8, the delay is set in a manner coordinated with the setting of the preload count in divide-by-16 counter 74 by using, for example, the same four bit data signal coupled as inputs 153 to counter 74. Delay alignment circuit 160 comprises two one shots 164, 166 in cascade. The first one shot 164 controls the time shift or delay between edges of 2 fH output signal 32 and 2 fH driving signal 167 that is supplied to second phase locked loop 54. The second one shot 166 controls the width of the pulses of driving signal 167.

One shot 164 provides a selectable delay, for example, controlled by microprocessor 115 via timing circuit 110 in FIG. 1. The extent of the delay may be chosen as a setup function to coordinate with the number of 32 fH cycles by which triggering output signal 32 was shifted by presettable binary counter 74. For example, the adjustable delay of one shot 164 is set to compensate for picture shift due to the delay introduced in divider 42.

The pulse width of one shot 164 is determined by the time constant of a capacitor C1 and a selected one of resistors R1–Rn, coupled to one shot 164 via a switching matrix 165. In the example shown, one of sixteen resistors R1–Rn is selected by a four bit input from timing circuit 110. The pulse width of one shot 166 is fixed by the values of a capacitor C2 and a resistor Ra, to a width that is suitable for use in second phase locked loop 54.

In multiplying phase locked loop 24 as shown and described, output signal 32 and drive signal 167 are generated at a first multiple of the received video sync signal 26. Voltage controlled oscillator 34 provides clock signals 36 at a second multiple of the received signal frequency which is higher than the first multiple. By inserting a phase shift for the division period of divider 74 to obtain the described phase alignment, modulation of output signal 32 is prevented. The phase of drive signal 167 is then corrected to the required drive phase.

Figure 9:
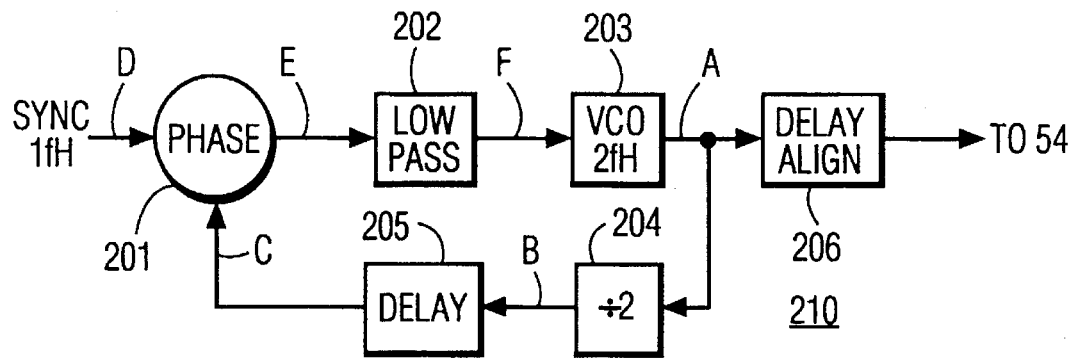
FIG. 9 is a block diagram illustrating a first inventive configuration of a synchronizing circuit, with a first delay in a feedback path and a second delay at an output.
Figure 10:
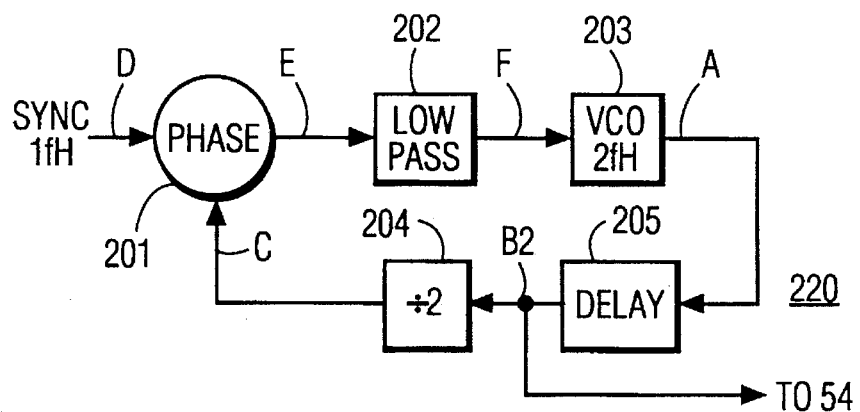
FIG. 10 is a block diagram showing a second inventive configuration having a delay in a feedback path leading to a frequency divider.

FIGS. 1 and 9–11 represent alternative inventive configurations in which delay circuits and frequency dividers are coupled in different arrangements relative to one another and relative to the low pass filter and oscillator. FIGS. 12(a)–12(f) show the timing of signals A–F at the labelled points in FIGS. 9 and 10, comparable to FIGS. 3(a)–3(h) and FIG. 1.

In FIGS. 9 and 10, phase locked loops 210, 220 each have phase comparator 201, low pass filter 202 and VCO 203, serially coupled to a 1 fH synchronizing signal D, with a feedback path to phase comparator 201 including a frequency divider 204, and a delay 205 needed to assure symmetrical oscillator output. Advantageously, VCO 203 operates at the same frequency as the scanning circuit, not shown, and produces a symmetrical 2 fH drive signal, synchronized to 1 fH synchronizing signal D. Output E of phase comparator 201 is coupled to low pass filter 202, whose output F is the control signal or tuning voltage for VCO 203. The output A of VCO 203 in each case is a symmetrical 2 fH signal where the durations of alternating cycles, ta–tb and tb–tc, are the same. In FIG. 9, delay alignment block 206 adjusts output A to achieve the drive phase needed for driving further circuits such as the second phase locked loop 54 of FIG. 1.

Figure 11:
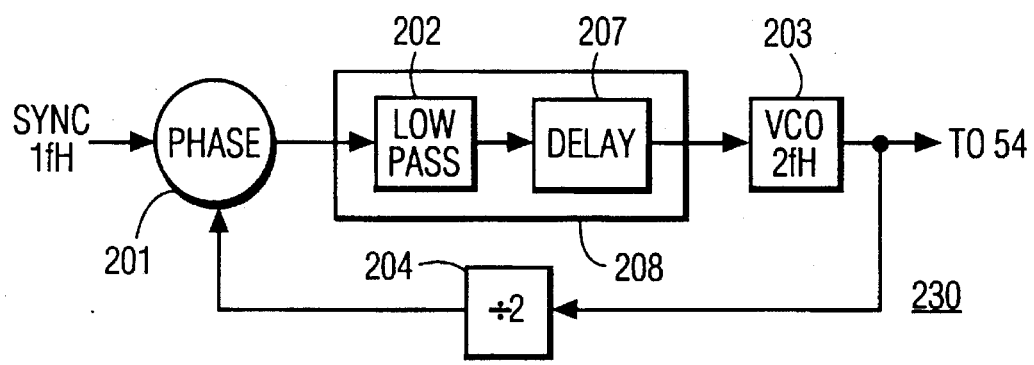
FIG. 11 is a block diagram showing a third inventive configuration that includes the combination of a low pass filter and a delay.

FIGS. 9–11 use the same reference numbers to identify corresponding circuit elements. The inventive circuit in FIG. 10 provides the same delay and feedback functions in a 2 fH phase locked loop 220, but requires only one delay, namely the delay 205 inserted in the feedback path. By placing delay 205 upstream of frequency divider 204, the output signal coupled to the second phase lock loop circuit 54 is phase correct, and at the same time feedback signal B2 may be properly adjusted in phase relative to output A of VCO 203, to obtain symmetrical oscillator operation.

As shown in FIGS. 12(a)–12(f), output A of VCO 203 is in each case symmetrical, but is out of phase, by e.g. the interval tc–td, with synchronizing input D and with tuning voltage F for VCO 203. In FIGS. 9 and 12(d), feedback signal B at 1 fH is out of phase with synchronizing input D. In FIGS. 10 and 12(e), feedback signal B2 is not only symmetrical, but is in phase with synchronizing input D. Frequency divider 204 then divides down the oscillator frequency for input to phase comparator 201. By operating VCO 203 out of phase with signals C or B2 along the feedback loop, both circuits provide a symmetrical 2 fH signal, i.e., without 1 fH modulation, and both circuits provide a phase comparison signal C to phase comparator 201 that keeps the circuit locked.

A further inventive configuration, as shown in FIG. 11, provides a delay in the path of the tuning voltage or control signal F rather than in the feedback path, for operating the VCO with a symmetrical output. In FIG. 11, analog delay 207 is coupled to the output of low pass filter 202 for this purpose. The low pass and delay functions may, for example, be produced in a single analog circuit having a multipole transfer function.

In all the inventive configurations shown, the phase locked loop generates an oscillator control signal tuning voltage that is indicative of the difference in phase or frequency between the 1 fH input horizontal sync signal and the oscillator output signal, where the output signal frequency is a higher integral multiple of the input signal frequency. The phase detector generates a tuning voltage, even after filtering, which exhibits a periodic variation, i.e. at a 1 fH rate. The tuning voltage, when applied to the oscillator control input, tends to produce a deviation of the oscillator output signal from its synchronized tracking condition, i.e. from its average period. Thus, the 1 fH cyclical variation in the tuning voltage produces a 1 fH variation from the average period of the 2 fH oscillator output. This variation could occur for other oscillators that provide scan drive at other, higher multiples of the synchronizing input signal. Due to the frequency control afforded by the phase locked loop, the average period of the oscillator output still tracks the average period of the input sync signal.

By controlling the phase of the oscillator output signal relative to the phase of the periodic variation in the tuning voltage, the deviation of the oscillator output is counteracted. In FIG. 1, this is accomplished by directly offsetting the phase of the 2 fH output signal by selecting the appropriate cycle of the 32 fH VCO 34 from which divider 42 begins its countdown. In FIGS. 9 and 10, the oscillator deviation is counteracted by offsetting the phase of the oscillator feedback signal, and in FIG. 11, by directly offsetting the phase of the tuning voltage produced by phase detector 201.

What is claimed is:

1. A synchronizing circuit, comprising:
    a source of a synchronizing input signal at an input frequency;
    an oscillator for providing an output signal at an output frequency that is a higher, integral multiple of the input frequency;
    means responsive to said input signal and a feedback signal representative of said output signal for generating a control signal that is indicative of a difference in phase or frequency between the input and output signals, said oscillator being responsive to said control signal for synchronized tracking of said oscillator output signal to said input signal, said control signal exhibiting a periodic variation which tends to result in a deviation of said oscillator output signal from its synchronized tracking condition in accordance with said periodic variation; and
    means coupled to said oscillator for offsetting a phase of said output signal relative to a corresponding phase of the periodic variation of said control signal for counteracting said deviation.

2. A circuit according to claim 1, wherein said phase offsetting means comprises a frequency divider coupled to a time shifting circuit in a path of said output signal generation, said feedback signal being developed at an output of said time shifting circuit.

3. A circuit according to claim 1, wherein said deviation of said oscillator output signal produces a variation of the period of said output signal in accordance with the periodic variation of said control signal.

4. A circuit according to claim 3, wherein the average period of said output signal remains unaffected by said periodic variation of said control signal and tracks the average period of said synchronizing input signal.

5. A circuit according to claim 1, further comprising a scanning circuit being driven by said output signal at a frequency higher than said input signal but synchronized thereto.

6. A circuit according to claim 1, wherein said phase offsetting means comprises a frequency divider coupled to a time shifting circuit in a path of said feedback signal.

7. A circuit according to claim 6, wherein said output signal is obtained at an output of said time shifting circuit.

8. A circuit according to claim 1, wherein the periodic variation of said control signal occurs at the input frequency.

9. A circuit according to claim 1, wherein said oscillator develops an oscillatory signal at an oscillatory frequency higher than that of said input frequency and that is an integral multiple of the input frequency, and including a divider responsive to said oscillatory signal for generating said output signal.

10. A circuit according to claim 9, wherein said phase offsetting means comprises means for offsetting a phase of a division period of said divider relative to a phase of said synchronizing input signal.

11. A circuit according to claim 10, including means for shifting a phase of said output signal to compensate for a phase offset generated by said phase offsetting means.

12. A circuit according to claim 11, further comprising a scanning circuit being driven by the phase shifted output signal at a frequency higher than said input signal but synchronized thereto.

13. A circuit according to claim 1, further including a scanning circuit for a video display responsive to said oscillator output signal and having a scanning interval established by the period of said output signal and subject to the variation thereof.

14. A synchronizing circuit, comprising:
    a source of a synchronizing input signal at an input frequency;
    an oscillator for providing an output signal at an output frequency that is a higher, integral multiple of the input frequency;
    means responsive to said input signal and a feedback signal representative of said output signal for generating a control signal that is indicative of a difference in phase or frequency between the input and output signals, said oscillator being responsive to said control signal for synchronized tracking of said oscillator output signal to said input signal, said control signal exhibiting a periodic variation which tends to result in a deviation of said oscillator output signal from its synchronized tracking condition in accordance with said periodic variation; and
    means coupled to said control signal generating means for offsetting a phase of said feedback signal relative to a corresponding phase of the output signal for counteracting said deviation.

15. A circuit according to claim 14, wherein said deviation of said oscillator output signal comprises a variation of the period of said output signal about an average period.

16. A synchronizing circuit responsive to a synchronizing signal at a sync frequency, comprising:
    a controllable oscillator for generating an oscillatory signal at a first multiple of the sync frequency;
    at least one divider for counting down the oscillatory signal over a division period, to provide an output signal at a second multiple of the sync frequency;

a phase comparator operable to compare an oscillator output and the synchronizing signal for producing a tuning signal coupled to said oscillator for synchronizing the output signal to said synchronizing signal; and means for offsetting a phase of the division period relative to a phase of the synchronizing signal.

17. The circuit of claim 16, wherein the tuning signal has a periodic component at the sync frequency, and where the phase offsetting means provides a phase offset that reduces a periodic component of the same frequency in the output signal.

18. The circuit of claim 17, wherein said phase offsetting means provides a phase offset such that the output signal has successive periods of substantially equal duration.

19. The circuit of claim 16, further comprising means for shifting a phase of the output signal to obtain a predetermined phase alignment with the synchronizing signal.

20. The circuit of claim 19, wherein the phase shifting means comprises a one-shot.

21. The circuit of claim 16, wherein said divider comprises a digital counter and said phase offsetting means includes means for at least one of presetting a predetermined starting count of the counter and triggering an output at a predetermined count of the counter.

22. A synchronizing circuit responsive to a synchronizing signal at a sync frequency, comprising:

a controllable oscillator for generating an oscillatory signal at a first multiple of the sync frequency;

at least one divider for counting down the oscillatory signal over a division period, to provide an output signal at a second multiple of the sync frequency, said divider comprising a digital counter;

a phase comparator operable to compare an oscillator output and the synchronizing signal for producing a tuning signal coupled to said oscillator for synchronizing the output signal to said synchronizing signal;

means for offsetting a phase of the division period relative to a phase of the synchronizing signal, said phase offsetting means including means for at least one of presetting a predetermined starting count of the counter and triggering an output at a predetermined count of the counter; and means for selecting the predetermined count, such that the phase of the division period is selectable relative to the phase of the synchronizing signal, for setting the average value of the tuning signal substantially equal during successive periods of the triggering signal.

23. A synchronizing circuit responsive to a synchronizing signal at a sync frequency, comprising:

a controllable oscillator for generating an oscillatory signal at a first multiple of the sync frequency;

at least one divider for counting down the oscillatory signal over a division period, to provide an output signal at a second multiple of the sync frequency, said divider comprising a first digital counter operable to count the first multiple of the sync frequency down to the second multiple of the sync frequency and a second counter operable to count down to the sync frequency;

a phase comparator operable to compare an oscillator output and the synchronizing signal for producing a tuning signal coupled to said oscillator for synchronizing the output signal to said synchronizing signal; and means for offsetting a phase of the division period relative to a phase of the synchronizing signal.

24. The circuit of claim 23, wherein the phase offsetting means comprises means for loading the first digital counter to a preset count.

25. The circuit of claim 24, wherein the first digital counter is supplied with a load signal such that the first digital counter is loaded to said preset count during each period of the synchronizing signal.

26. The circuit of claim 25, further comprising a controller coupled to the first digital counter for providing the preset count.

27. The circuit of claim 26, further comprising a delay means coupled to the output signal, where the delay means is settable to a predetermined delay by the controller.

28. The circuit of claim 25, further comprising a delay means coupled to the output signal for providing a drive signal at a settable delay relative to the output signal, and wherein the preset count of the first digital counter and the settable delay are coordinated for aligning a phase of the drive signal relative to the synchronizing input signal.

29. The circuit of claim 16, further comprising a scanning circuit responsive to the output signal for scanning at the second multiple of the sync frequency.

30. The circuit of claim 29, wherein the sync frequency represents a horizontal video line scanning frequency and wherein the output signal has a frequency of twice the sync frequency for noninterlaced scanning.

31. The circuit of claim 29, further comprising a phase locked loop coupled to the scanning circuit, the phase locked loop being responsive to an output of the phase offsetting means.

32. The circuit of claim 19, wherein the phase shifting means and the phase offsetting means are coordinated to maintain the predetermined phase alignment with the synchronizing input signal.

33. The circuit according to claim 32, wherein the phase offsetting means comprises a digital counter and the phase shifting means comprises a one shot with a selectable pulse width, a controller being operable to select the predetermined count and an extent of the pulse width.

34. A synchronizing circuit, comprising:

a source of a synchronizing input signal;

a source of clock signals;

means for synchronizing said clock signals to said input signal, said clock signals exhibiting a periodic variation in frequency within each period of said synchronizing input signal;

a divider coupled to said source of clock signals for dividing the frequency of said clock signals to obtain an output signal of frequency higher than that of said input signal; and means for offsetting a phase of a division period of said divider relative to a phase of said synchronizing input signal in order to counteract said periodic variation in frequency.

35. A circuit according to claim 34, including means for shifting a phase of said output signal to compensate for a phase offset generated by said phase offsetting means.

36. A circuit according to claim 35, further comprising a scanning circuit being driven by the phase shifted output signal at a frequency higher than said input signal but synchronized thereto.

* * * * *